(12) United States Patent
Wu et al.

(10) Patent No.: US 10,851,460 B2
(45) Date of Patent: Dec. 1, 2020

(54) COATING FOR A VAPOR CHAMBER

(71) Applicant: HEWLETT-PACKARD DEVELOPMENT COMPANY, L.P., Houston, TX (US)

(72) Inventors: Kuan-Ting Wu, Taipei (TW); Kevin Voss, Houston, TX (US); Chi-Hao Chang, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 145 days.

(21) Appl. No.: 16/074,552

(22) PCT Filed: Oct. 7, 2016

(86) PCT No.: PCT/US2016/056017
§ 371 (c)(1),
(2) Date: Aug. 1, 2018

(87) PCT Pub. No.: WO2018/067174
PCT Pub. Date: Apr. 12, 2018

(65) Prior Publication Data
US 2019/0048476 A1    Feb. 14, 2019

(51) Int. Cl.
*C23C 28/00* (2006.01)
*C23C 14/16* (2006.01)
(Continued)

(52) U.S. Cl.
CPC .............. *C23C 28/34* (2013.01); *C23C 14/16* (2013.01); *C23C 28/00* (2013.01); *C23C 28/32* (2013.01);
(Continued)

(58) Field of Classification Search
None
See application file for complete search history.

(56) References Cited

U.S. PATENT DOCUMENTS 5,955,140 A * 9/1999 Smith ............... H01L 21/02343
438/778
7,609,520 B2 10/2009 Chang et al.
(Continued)

FOREIGN PATENT DOCUMENTS

CN    102065984    5/2011
CN    102351494    2/2012
(Continued)

OTHER PUBLICATIONS

Altman et al., "Thermal Ground Plane Vapor Chamber Heat Spreaders for High Power and Packaging Density Electronic Systems", Retrieved from Internet: http://www.electronics-cooling.com/2012/03/thermal-ground-plane-vapor-chamber-heat-spreaders-for-high-power-and-packaging-density-electronic-systems/, 2012, 4 pages.
(Continued)

*Primary Examiner* — Nathan T Leong
(74) *Attorney, Agent, or Firm* — HPI Patent Department

(57)    ABSTRACT

In example implementations, a vapor chamber is provided. The vapor chamber includes a metallic housing. A nickel coating is applied on inside walls of the metallic housing. A silica derived carbon nanotube (CNT) aerogel coating is applied on the nickel coating on the inside walls of the metallic housing. The silica derived CNT aerogel coating is sprayed onto the nickel coating, dried and cured.

10 Claims, 4 Drawing Sheets

(51) Int. Cl.
*C23C 30/00* (2006.01)
*H01L 23/427* (2006.01)
*B82Y 30/00* (2011.01)
*H01L 23/373* (2006.01)

(52) U.S. Cl.
CPC .............. *C23C 30/00* (2013.01); *B82Y 30/00* (2013.01); *C23C 30/005* (2013.01); *H01L 23/3735* (2013.01); *H01L 23/427* (2013.01)

(56) References Cited

U.S. PATENT DOCUMENTS

| 2007/0284089 | A1 | 12/2007 | Vadakkanmaruveedu et al. |
| 2008/0128116 | A1 | 6/2008 | Dangelo et al. |
| 2008/0283222 | A1 | 11/2008 | Chang et al. |
| 2009/0040726 | A1* | 2/2009 | Hoffman ............ F28D 15/0233 361/700 |
| 2010/0224354 | A1 | 9/2010 | Dooley et al. |
| 2010/0294467 | A1 | 11/2010 | Varanasi et al. |
| 2012/0325439 | A1 | 12/2012 | Altman et al. |

FOREIGN PATENT DOCUMENTS

| CN | 102732070 | | 10/2012 |
| CN | 105392343 | | 3/2016 |
| WO | 1999065821 | A1 | 12/1999 |
| WO | WO9965821 | | 12/1999 |
| WO | 2010045904 | A2 | 4/2010 |
| WO | WO2010045904 | | 4/2010 |
| WO | WO2010045904 | * | 7/2010 |
| WO | 2013056847 | A1 | 4/2013 |
| WO | WO2013056847 | | 4/2013 |

OTHER PUBLICATIONS

Cai et al., "High Heat Flux Phase Change on Porous Carbon Nanotube Structures", International Journal of Heat and Mass Transfer, vol. 55, Abstract, Retrieved from Internet : https://www.researchgate.net/publication/256718620_High_heat_flux_phase_change_on_porous_carbon_nanotube_structures, Oct. 2012, 3 pages.
Weibel et al., "Experimental Characterization of Capillary-fed Carbon Nanotube Vapor Chamber Wicks", Journal of Heat Transfer, vol. 135, Retrieved from Internet: http://docs.lib.purdue.edu/cgi/viewcontent.cgi?article=2336&context=nanopub, Feb. 2013, 8 pages.
Weibel et al., "Characterization and Nanostructured Enhancement of Boiling Incipience in Capillary-fed, Ultra-thin Sintered Powder Wicks", Abstract, Retrieved from Internet: http://ieeexploreieee.org/xpl/articleDetails.jsp?arnumber=6231422&newsearch=true&queryText=Silica%20CNT%20Vapor%20Chamber%20wick%20aerogel, 2012, 2 pages.
Qu Xuping et al. Study on Process Parameters for Hydrolysis and Aggregation of Ethyl silicate and Synthesis of Nano silica, Class &Enamel, Jun. 6. 2005, p. 24-28, vol. 31 No. 3.
Zhang Zhihua et al. Silica Aerogel Materials Preparation Properties and Applications in Low-Temperature Thermal Insulation, Journal of Aerobautical Materials, 2015, pp. 87-96, vol. 35, No. 1.

* cited by examiner

COATING FOR A VAPOR CHAMBER

BACKGROUND

Vapor chambers are used for various electronic devices to help transfer heat away from the electronic devices. For example, high temperatures can negatively affect the operation of electronic devices such as computer processors.

Vapor chambers operate by taking heat from an electronic device on one side to heat a liquid within the vapor chamber into a vapor. The vapors rise to an opposite side of the vapor chamber that acts as a condenser. The vapors are condensed back into a liquid form against the condenser portion of the vapor chamber. The liquid is then returned to the side that takes in the heat and the process is repeated to dissipate heat away from the electronic device.

Existing designs for vapor chambers use a copper powder to form a wick structure. The copper can be sintered to form a thicker coat for high process temperatures. Other examples use a lithography process to form wick structures on the inside walls of the vapor chambers. However, the sintering process and the lithography process can have long process times and high costs.

DETAILED DESCRIPTION

The present disclosure provides a vapor chamber and method for building the vapor chamber. As discussed above, vapor chambers are used for various electronic devices to help transfer heat away from the electronic devices.

Existing designs for vapor chambers use a copper powder to form a wick structure. The copper can be sintered to form a thicker coat for high process temperatures. Other examples use a lithography process to form wick structures on the inside walls of the vapor chambers. However, the sintering process and the lithography process can have long process times and high costs.

The present disclosure uses a silica derived CNT aerogel that is sprayed onto an inside wall of the vapor chamber, dried and cured to form the wick structure. The silica derived CNT aerogel has many advantages over the existing wick structures used in vapor chambers. For example, the silica derived CNT aerogel is easy to apply without using a lithography process or sintering process. In addition, the silica derived CNT aerogel has a low density, a light weight, a high porosity and a high surface area that enhances heat transfer and heat dissipation performance within the vapor chamber. Furthermore, the chemistry of the silica derived CNT aerogel provides strong hydrogen bonding in order to have high water absorption and enhances capillary force ability of the wick structure.

Figure 1:
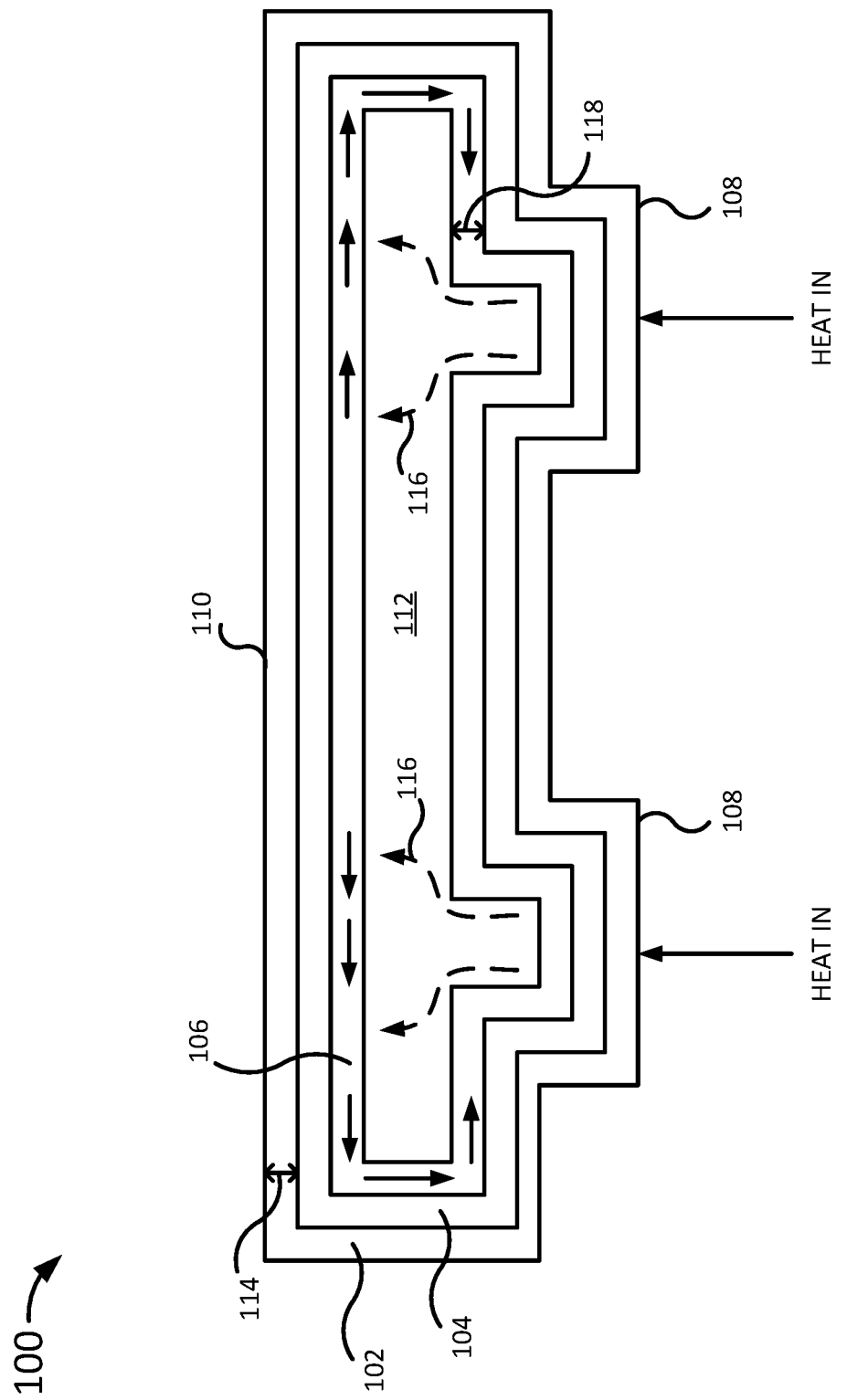
FIG. 1 is a block diagram of an example vapor chamber of the present disclosure.

FIG. 1 illustrates a block diagram of an example vapor chamber 100 of the present disclosure. The vapor chamber 100 includes a metallic housing 102, a nickel coating 104 and a silica derived carbon nanotube (CNT) aerogel coating 106. In one implementation the metallic housing 102 may be any conductive metal, such as for example, copper, aluminum, stainless steel, and the like. The metallic housing 102 may have a thickness 114 of approximately 0.1 millimeters (mm) to 6 mm.

In one example, the nickel coating 104 may be applied using an electroplating processor or a physical vapor deposition (PVD) process. The nickel coating 104 may be applied to prevent the metallic housing 102 from oxidizing, which can lead to corrosion of the surface of the metallic housing 102.

In one example, the silica derived CNT aerogel coating 106 may be sprayed on, dried and cured. The silica derived CNT aerogel coating 106 may provide the wick structure that performs the heat transfer. One example of how the silica derived CNT aerogel coating 106 is formulated is described below and illustrated in FIG. 3. An example of the chemical structure of the silica derived CNT aerogel coating 106 is discussed below and illustrated in FIG. 4.

The silica derived CNT aerogel coating 106 may have a high porosity, which provides a greater surface area. The large surface area helps to improve the efficiency of heat transfer within the vapor chamber 100. In addition, the silica derived CNT aerogel coating 106 may be sprayed onto the surface of the metallic housing 102, rather than using a lithography process or sintering to form the wick structure.

FIG. 1 illustrates one example of how the vapor chamber 100 operates. In one example, one or more surfaces 108 (e.g., a bottom surface) may be in contact with a heat source (e.g., an operating electronic device). For example, the surfaces 108 may be in contact with a processor, a memory device, or other electronic component that generates heat. The heat may enter the vapor chamber 100 via the surfaces 108.

The vapor chamber 100 may have an inside or internal volume 112. The internal volume 112 may be vacuum sealed and be injected with a small amount of liquid (e.g., water) that wets the silica derived CNT aerogel coating 106. The heat that enters the vapor chamber 100 heats the liquid and converts the liquid into a vapor.

As the vapor rises (as shown by arrows 116), the vapor may contact a second surface 110 that is opposite the surface 108 (e.g., a top surface). The second surface 110 may act as a condenser that converts the vapor back into liquid form. The liquid may return back to the bottom of the internal volume 112 to re-wet the silica derived CNT aerogel coating 106 so that the process may be repeated.

The heat may be dissipated away from the electronic device through the top second surface 110. In some examples, heat fins or other conductive materials may be coupled to an outer side of the second surface 110 to help further dissipate the heat away.

As noted above, the chemical properties and structural properties of the silica derived CNT aerogel coating 106 may help improve the efficiency of the heat transfer. The silica derived CNT aerogel coating 106 may have a high porosity that greatly increases the surface area available to perform the heat transfer. For example, the silica derived CNT aerogel coating 106 may have an approximately 90%-95% void. Said another way, the silica derived CNT aerogel coating 106 may have a surface area of approximately 250 square meters per gram ($m^2/g$) to 1,000 $m^2/g$.

In one example, the carbon nanotubes within the silica derived CNT aerogel coating 106 may have a diameter of approximately 7-12 nanometers (nm) and have a length of approximately 1-3 microns ($\mu m$). In one example, the silica derived CNT aerogel coating 106 may be sprayed on or applied to a thickness 118 of approximately 3-25 μm.

Figure 2:
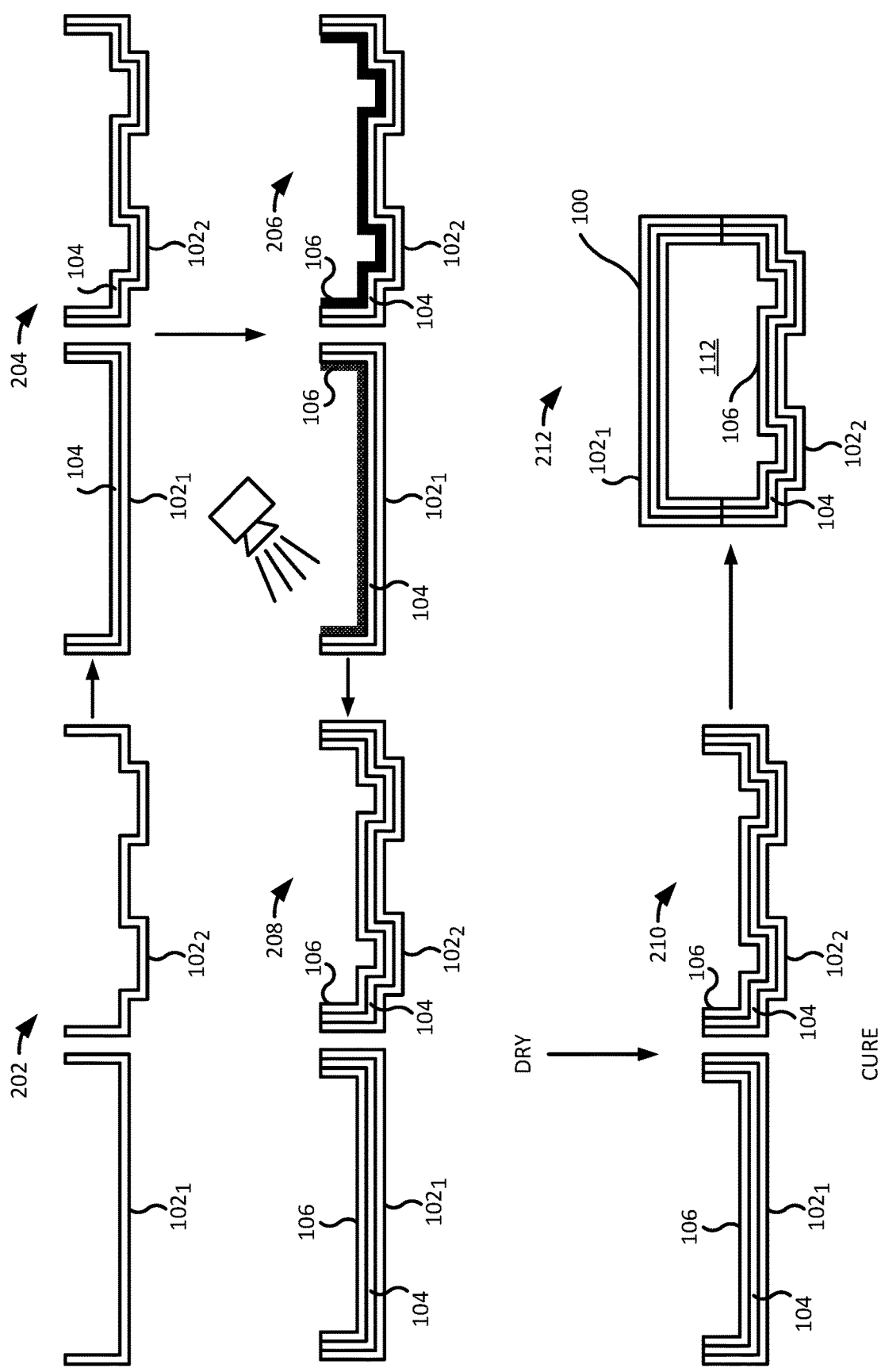
FIG. 2 is a block diagram of an example process flow diagram of the present disclosure.

FIG. 2 illustrates an example process flow diagram of how the vapor chamber 100 is formed. At block 202 a first metallic substrate $102_1$ and a second metallic substrate $102_2$ are provided. The first metallic substrate $102_1$ and the second metallic substrate $102_2$ may be two halves that are combined, as discussed below to form the metallic housing 102.

The first metallic substrate $102_1$ and the second metallic substrate $102_2$ may be the same conductive metal. For example, the first metallic substrate $102_1$ and the second metallic substrate $102_2$ may be copper, aluminum, stainless steel, and the like.

At block 204 a nickel coating 104 is applied to the first metallic substrate $102_1$ and the second metallic substrate $102_2$. The nickel coating 104 may be applied via an electroplating process or a PVD process.

At block 206, a silica derived CNT aerogel coating 106 may be sprayed onto the nickel coating 104 of the first metallic substrate $102_1$ and the second metallic substrate $102_2$. The silica derived CNT aerogel coating 106 may form the wick structure for the vapor chamber 100. Notably, the silica derived aerogel coating 106 may be sprayed on or applied without using lithography or sintering.

At block 208, the silica derived CNT aerogel coating 106 may be dried. In one example, the silica derived CNT aerogel coating 106 may be dried using a freeze drying process. The freeze drying process may be applied at a temperature of approximately −4 Celsius (° C.) to −80° C. and at a pressure of approximately $4\times10^{-4}$ to $5\times10^{-4}$ milliTorr (mTorr) for approximately 24 hours to 48 hours.

In another example, the silica derived CNT aerogel coating 106 may be dried using a supercritical drying process. The supercritical drying process may be applied at a temperature of approximately 35° C. to 250° C. and at a pressure of approximately 30 bar to 150 bar for approximately 30 minutes to 120 minutes.

At block 210, the silica derived CNT aerogel coating 106 may be cured. The curing may be performed at a temperature of approximately 300° C. to 500° C. for approximately 30 minutes to 40 minutes.

At block 212, the first metallic substrate $102_1$ and the second metallic substrate $102_2$ may be welded together to form the vapor chamber 100 having the silica derived CNT aerogel coating 106 cured onto the nickel coating 104 on an inside 112 of the vapor chamber 100. In one implementation, the vapor chamber 100 may be vacuum sealed to remove any air from the inside 112 of the vapor chamber 100. In addition, a small amount of liquid, such as water, may be injected into the inside 112 of the vapor chamber 100 to wet the silica derived CNT aerogel coating 106.

Figure 3:
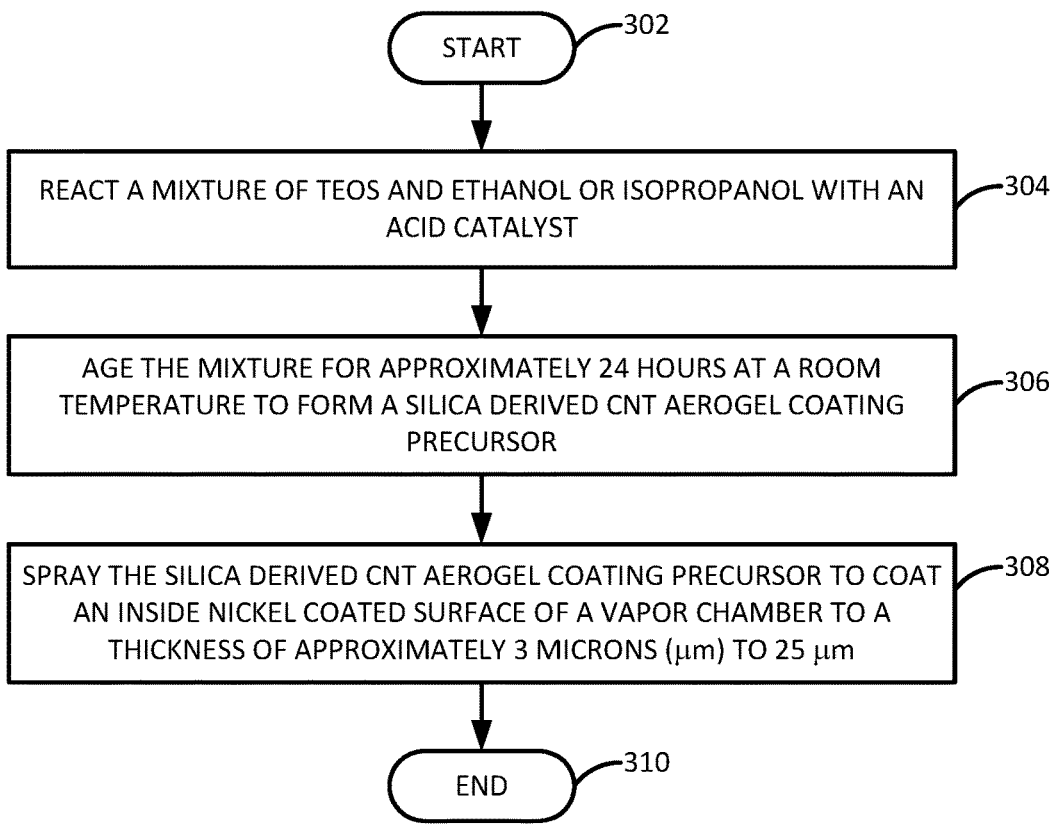
FIG. 3 is a flow diagram of an example method for forming a silica derived carbon nanotube (CNT) aerogel of the present disclosure.

FIG. 3 illustrates a flow diagram of an example method 300 for forming a silica derived carbon nanotube (CNT) aerogel of the present disclosure. At block 302, the method 300 begins.

At block 304, the method 300 reacts a mixture of tetraethylorthosilicate (TEOS) and ethanol or isopropanol with an acid catalyst, while stirring for approximately 30-60 minutes at a room temperature. The acid catalyst may be one of carbonic acid, oxalic acid, phosphoric acid, hydrochloric acid or nitric acid. Room temperature may be defined to be approximately 20° C.

At block 306 the method 300 ages the mixture for approximately 24 hours at a room temperature to form the silica derived CNT aerogel coating precursor. The silica derived CNT aerogel may form carbon nanotubes having a diameter of approximately 8-12 nm and a length of approximately 1-3 μm. As described above, the silica derived CNT aerogel may have a high porosity that creates a large surface area of approximately 250-1,000 $m^2/g$.

Figure 4:
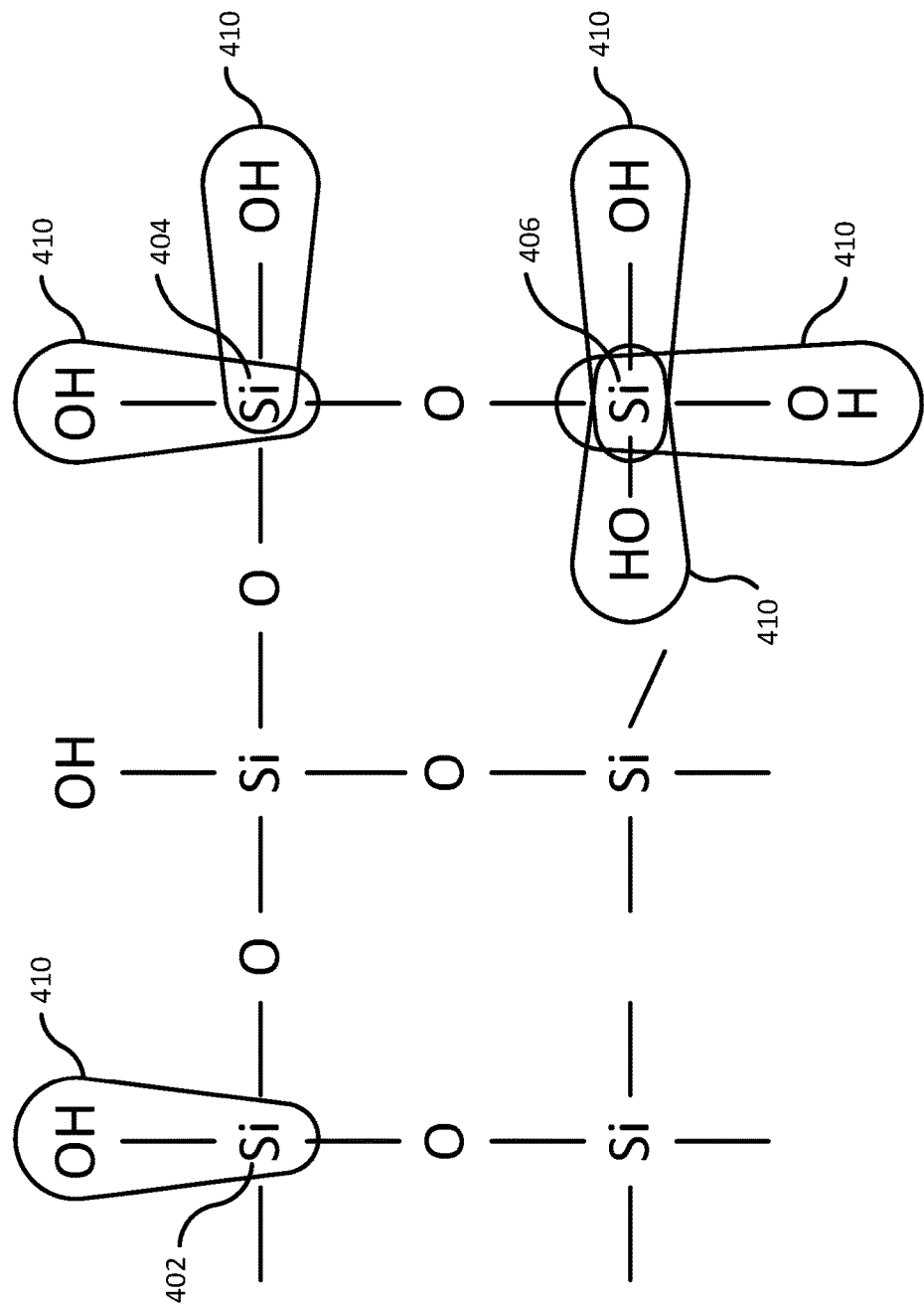
FIG. 4 is a diagram of an example chemical structure of the silica derived CNT aerogel.

FIG. 4 illustrates an example chemical structure 400 of the silica derived CNT aerogel. The chemical structure 400 shows that the silica derived CNT aerogel includes a high amount of hydroxyl (OH) groups 410 on silanol groups 402, 404 and 406. The large amounts of OH groups 410 provide a strong hydrogen bonding in order to have high water absorption and also enhance the capillary force ability of the silica derived CNT aerogel. These properties of the chemical structure 400 provide a very efficient heat transfer for the vapor chamber 100 and help improve the liquid return rate within the wick structure.

Referring back to FIG. 3, at block 308, the method 300 sprays the silica derived CNT aerogel to coat an inside nickel coated surface of a vapor chamber to a thickness of approximately 3 μm to 25 μm. The coating of the silica derived CNT aerogel may be dried and cured. In one example, the silica derived CNT aerogel coating precursor may be sprayed onto two halves of the metallic housing of the vapor chamber that are eventually welded together. At block 310, the method 300 ends.

As a result, the present disclosure provides a vapor chamber design that is more efficient to produce and that dissipates heat away more efficiently than currently used vapor chambers. The composition and structure of the silica derived CNT aerogel help to provide properties and characteristics that allow the silica derived CNT aerogel to be easily applied to the inside walls of the vapor chamber and increase the efficiency of heat transfer of the vapor chamber.

In addition, the design of the vapor chamber of the present disclosure has a reduced thickness compared to vapor chambers produced via a copper powder sintering treatment. The light weight of the silica derived CNT aerogel coating also provides flexible design capability to match the design space for electronic devices with weight reduction.

With the improved efficiency of the heat transfer provided by the vapor chamber of the present disclosure, lifetimes of products such as liquid crystal display (LCD) panels, light emitting diodes (LEDs), computer processing unites (CPUs), batteries and the like may be extended. In addition, by efficiently cooling electronic devices, the vapor chamber of the present disclosure may improve speed, power efficiency and safety (e.g., reducing the risk of battery explosion) of these electronic devices.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A method, comprising:
providing a first metallic substrate and a second metallic substrate;
applying a nickel coating to the first metallic substrate and the second metallic substrate;
spraying a silica derived carbon nanotube (CNT) aerogel coating onto the nickel coating of the first metallic substrate and the second metallic substrate;
drying the silica derived CNT aerogel coating;
curing the silica derived CNT aerogel coating; and
welding the first metallic substrate to the second metallic substrate to form a vapor chamber having the silica derived CNT aerogel coating cured onto the nickel coating on an inside of the vapor chamber.

2. The method of claim 1, wherein the first metallic substrate and the second metallic substrate each comprises at least one of: copper, aluminum or stainless steel.

3. The method of claim 1, wherein the nickel coating is applied via at least one of: an electroplating process or a physical vapor deposition process.

4. The method of claim 1, wherein the silica derived CNT aerogel is dried using a freeze drying process at a temperature of approximately −4 Celsius (° C.) to −80° C. at a pressure of approximately $4\times10^{-4}$ to $5\times10^{-4}$ milli-Torr (mTorr) for approximately 24 hours to 48 hours.

5. The method of claim 1, wherein the silica derived CNT aerogel is dried using a supercritical drying process at a temperature of approximately 35 Celsius (° C.) to 250° C. at a pressure of approximately 30 bar to 150 bar for approximately 30 minutes to 120 minutes.

6. The method of claim 1, wherein the silica derived CNT aerogel is cured at a temperature of approximately 300 Celsius (° C.) to 500° C. for approximately 30 minutes to 40 minutes.

7. The method of claim 1, further comprising preparing a silica derived CNT aerogel by:

reacting a mixture of tetraethylorthosilicate (TEOS) and ethanol or isopropanol with an acid catalyst, while stirring for approximately 30-60 minutes at a room temperature; and aging the mixture for approximately 24 hours at the room temperature to form a silica derived carbon nanotube (CNT) aerogel to apply as the silica derived CNT aerogel coating.

8. The method of claim 7, wherein the acid catalyst comprises at least one of: carbonic acid, oxalic acid, phosphoric acid, hydrochloric acid or nitric acid.

9. The method of claim 7, wherein the silica derived CNT aerogel comprises carbon nanotubes having a diameter of approximately 8-12 nanometers (nm) and a length of approximately 1-3 μm and has a surface area of approximately 250-1,000 square meters per gram ($m^2/g$).

10. The method of claim 7, wherein spraying the silica derived CNT aerogel coating includes coating the nickel coating, wherein the nickel coating on the first metallic substrate or the second metallic substrate includes an inside surface of a vapor chamber that is coated by the silica derived CNT aerogel coating at a thickness of approximately 3 microns (μm) to 25 μm.

* * * * *